(12) United States Patent
Chen et al.

(10) Patent No.: US 11,309,308 B2
(45) Date of Patent: Apr. 19, 2022

(54) ESD PROTECTION CIRCUIT

(71) Applicant: ANPEC ELECTRONICS CORPORATION, Hsinchu (TW)

(72) Inventors: Kun-Min Chen, Hsinchu (TW); Chien-Lun Chu, Kaohsiung (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 218 days.

(21) Appl. No.: 16/108,600

(22) Filed: Aug. 22, 2018

(65) Prior Publication Data
US 2019/0371788 A1 Dec. 5, 2019

(30) Foreign Application Priority Data

Jun. 4, 2018 (TW) .................................. 10711917.4

(51) Int. Cl.
*H01L 27/02* (2006.01)
*H02H 9/04* (2006.01)

(52) U.S. Cl.
CPC ...... *H01L 27/0266* (2013.01); *H01L 27/0255* (2013.01); *H02H 9/046* (2013.01)

(58) Field of Classification Search
CPC .......... H02H 9/045; H02H 9/046; H02H 9/04; H01L 27/0266; H01L 27/0255; H01L 27/0285; H01L 27/0251
See application file for complete search history.

(56) References Cited

U.S. PATENT DOCUMENTS

| | | | | | |
|---|---|---|---|---|---|
| 5,276,582 | A | * | 1/1994 | Merrill | H01L 27/0255 361/111 |
| 5,742,084 | A | * | 4/1998 | Yu | H01L 27/0251 257/356 |
| 5,869,873 | A | * | 2/1999 | Yu | H02H 9/046 257/362 |
| 5,892,262 | A | * | 4/1999 | Wu | H01L 27/0251 257/356 |
| 6,229,183 | B1 | * | 5/2001 | Lee | H01L 27/0259 257/173 |
| 6,501,632 | B1 | * | 12/2002 | Avery | H01L 27/0277 361/111 |
| RE38,222 | E | * | 8/2003 | Wu | H01L 27/0251 257/355 |

(Continued)

FOREIGN PATENT DOCUMENTS

CN 103036552 A 4/2013

*Primary Examiner* — Yusef A Ahmed
(74) *Attorney, Agent, or Firm* — Li & Cai Intellectual Property (USA) Office

(57) ABSTRACT

An electrostatic discharge protection circuit includes an internal circuit, a pad, a first high voltage transistor, an electrostatic protection element and a control circuit. A first terminal of the first high voltage transistor is coupled to the pad, a second terminal of the first high voltage transistor is coupled to the internal circuit and includes a control terminal. The electrostatic protection element has one end coupled to the first end of the first high voltage transistor and the other end grounded. The control circuit is coupled between the control terminal of the first high voltage transistor and the ground terminal. The control circuit is configured to control the first high voltage transistor to turn off when the pad receives an electrostatic voltage.

6 Claims, 4 Drawing Sheets

(56) References Cited

U.S. PATENT DOCUMENTS

| | | | | |
|---|---|---|---|---|
| 6,633,468 B1* | 10/2003 | Duvvury | H01L 27/0266 | 361/111 |
| 6,671,153 B1* | 12/2003 | Ker | H01L 27/0255 | 361/111 |
| 6,728,084 B2* | 4/2004 | Ziemer | H02H 9/046 | 361/33 |
| 7,057,867 B1* | 6/2006 | Vashchenko | H01L 27/0259 | 361/56 |
| 7,592,673 B2* | 9/2009 | Burdeaux | H01L 29/861 | 257/355 |
| 7,593,204 B1* | 9/2009 | Iversen | H02H 9/046 | 361/56 |
| 7,821,752 B2* | 10/2010 | Choi | H02H 9/046 | 361/56 |
| 7,839,612 B1* | 11/2010 | Chan | H01L 27/0285 | 361/56 |
| 7,910,950 B1* | 3/2011 | Vashchenko | H01L 27/0266 | 257/124 |
| 7,911,752 B1 | 3/2011 | Lin et al. | | |
| 8,441,770 B2* | 5/2013 | Menegoli | H03K 17/08142 | 361/144 |
| 8,467,162 B2* | 6/2013 | Wang | H01L 27/0262 | 361/56 |
| 9,153,570 B2* | 10/2015 | Wang | H01L 27/0262 | |
| 9,373,612 B1* | 6/2016 | Huang | H01L 27/0288 | |
| 9,953,968 B2* | 4/2018 | Cao | H01L 27/0255 | |
| 10,236,684 B2* | 3/2019 | Wakita | H02H 9/04 | |
| 2002/0071230 A1* | 6/2002 | Colclaser | H01L 27/0266 | 361/56 |
| 2002/0154462 A1* | 10/2002 | Ker | H01L 27/0274 | 361/56 |
| 2004/0141269 A1* | 7/2004 | Kitagawa | H01L 27/0251 | 361/56 |
| 2005/0030688 A1* | 2/2005 | Sakihama | H01L 27/0285 | 361/91.1 |
| 2008/0013231 A1* | 1/2008 | Bazzano | H01L 27/0259 | 361/56 |
| 2008/0123229 A1* | 5/2008 | Choi | H02H 9/046 | 361/56 |
| 2009/0057768 A1* | 3/2009 | Chen | H01L 27/0251 | 257/360 |
| 2009/0073619 A1* | 3/2009 | Chen | H02H 9/046 | 361/56 |
| 2009/0091870 A1* | 4/2009 | Huang | H02H 9/046 | 361/56 |
| 2009/0091871 A1* | 4/2009 | Hung | H02H 9/046 | 361/56 |
| 2009/0268360 A1* | 10/2009 | Shinomiya | H02H 9/046 | 361/56 |
| 2010/0118457 A1* | 5/2010 | Kwak | H01L 27/0262 | 361/56 |
| 2010/0271739 A1* | 10/2010 | Hirata | H01L 27/0266 | 361/56 |
| 2010/0328826 A1* | 12/2010 | Salman | H01L 27/0802 | 361/56 |
| 2011/0038084 A1* | 2/2011 | Lo | H02H 9/046 | 361/56 |
| 2011/0227127 A1* | 9/2011 | Ohta | H01L 27/0262 | 257/133 |
| 2012/0243133 A1* | 9/2012 | Wu | H01L 27/0285 | 361/56 |
| 2012/0275072 A1* | 11/2012 | Chen | H01L 29/87 | 361/56 |
| 2012/0313095 A1* | 12/2012 | Liao | H01L 27/0255 | 257/49 |
| 2013/0307017 A1* | 11/2013 | Chen | H01L 27/0262 | 257/133 |
| 2013/0341676 A1* | 12/2013 | Lee | H01L 27/0262 | 257/148 |
| 2014/0111893 A1* | 4/2014 | Kato | H02H 9/046 | 361/56 |
| 2014/0210053 A1* | 7/2014 | Steinhoff | H01L 27/0207 | 257/577 |
| 2014/0285932 A1* | 9/2014 | Miyamoto | H02H 9/046 | 361/56 |
| 2014/0368958 A1* | 12/2014 | Ikimura | H02H 9/046 | 361/56 |
| 2015/0311700 A1* | 10/2015 | Lee | H02H 9/04 | 361/56 |
| 2016/0087423 A1* | 3/2016 | Chen | H02H 9/046 | 361/56 |
| 2016/0261105 A1* | 9/2016 | Kato | H02H 9/041 | |
| 2017/0005602 A1* | 1/2017 | Chen | H02P 6/12 | |
| 2017/0155243 A1* | 6/2017 | Tan | H02H 9/046 | |
| 2017/0291415 A1* | 10/2017 | Matsumoto | B41J 2/14072 | |
| 2017/0366004 A1* | 12/2017 | Nishikawa | H03K 19/00315 | |
| 2018/0097357 A1* | 4/2018 | Di Sarro | H02H 9/046 | |
| 2018/0287377 A1* | 10/2018 | Zou | H01L 27/0285 | |
| 2018/0287378 A1* | 10/2018 | Sithanandam | H01L 29/0649 | |
| 2019/0326750 A1* | 10/2019 | Ting | H02H 9/046 | |
| 2021/0035969 A1* | 2/2021 | Chen | H02H 9/045 | |

* cited by examiner

ESD PROTECTION CIRCUIT

CROSS-REFERENCE TO RELATED PATENT APPLICATION

This application claims the benefit of priority to Taiwan Patent Application No. 107119174, filed on Jun. 4, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrostatic discharge (ESD) protection circuit, and more particularly to an electrostatic discharge protection circuit that reduces the layout area of a circuit by adopting a configuration of a control circuit and a high voltage transistor.

BACKGROUND OF THE DISCLOSURE

Electrostatic discharge (ESD) is a phenomenon in which electrostatic charge travels along the surface of a nonconductive material that could destroy circuit devices in an integrated circuit and other circuits. For example, when a human body walks over a carpet, thousands of volts of electrostatic potential can be detected in an environment with relatively high humidity, whereas tens of thousands of volts can be detected in an environment with relatively low humidity. In packaging or testing machines, static charges of hundreds or thousands of voltages are generated as well. When objects like human bodies or machines are in contact with chips of integrated circuits, electrostatic charges are discharged into the chips. The electrostatic discharge pulses can damage the integrated circuits of the chips. In order to prevent damage caused by electrostatic discharge, electrostatic discharge protection circuits are designed and applied to integrated circuits.

Generally, an internal circuit coupled to the pad is often provided with a first conductive type of bonding region, for example, a high-voltage N-well (HVNW), and forms an N-P-N-P-type architecture with other internal components. The breakdown voltage of this N-P-N-P-type architecture is very likely to be lower than the reverse conduction voltage of the ESD protection component. Therefore, in general circuit designs, the internal circuit needs to be laid out in a manner complying with static protection rules, so that a device coupled with the pad needs to be spaced apart from other devices, for example, by 60 μm, so that the breakdown voltage of the N-P-N-P-type architecture may be higher than the reverse conduction voltage of the ESD protection component.

However, under the premise of following the static protection rules, a large area is required in the circuit layout design, the time cost of the layout design may be increased, and furthermore, the layout must be redesigned for certain fixed circuit modules.

Therefore, how the area required for the internal circuit can be reduced during the circuit layout design by improving the electrostatic circuit architecture to overcome the above-mentioned defects has become an important issue in the art.

SUMMARY OF THE DISCLOSURE

One object of the present disclosure is to provide an electrostatic discharge protection circuit for reducing the area required for an internal circuit during circuit layout design, while achieving electrostatic protection.

In order to solve the above technical problem, one of the technical solutions used by the present disclosure is to provide an electrostatic discharge protection circuit including an internal circuit, a pad, a first high voltage transistor, an electrostatic protection component, and a control circuit. The first high voltage transistor has a first end coupled to the pad and a second end coupled to the internal circuit, and includes a control terminal. The electrostatic protection element has one end coupled to the first end of the first high voltage transistor and the other end grounded. The control circuit is coupled between the control terminal of the first high voltage transistor and a ground terminal, the control circuit is configured to control the first high voltage transistor to be turned off when the pad receives an electrostatic voltage.

Preferably, the first high voltage transistor is a depletion type N-type metal oxide semiconductor field effect transistor (MOSFET), a drain electrode of the first high voltage transistor is coupled to the pad, and a source electrode of the first high voltage transistor is coupled to the internal circuit. The control circuit further includes a first resistor and a second high voltage transistor. A first end of the first resistor is coupled to the pad and the drain electrode of the first high voltage transistor. The drain electrode of the second high voltage transistor is coupled to a second end of the resistor and the control terminal of the first high voltage transistor, and a source electrode and a gate electrode of the second high voltage transistor are grounded.

Preferably, the first high voltage transistor is a P-type metal oxide semiconductor field effect transistor (MOSFET), a source electrode of the first high voltage transistor is coupled to the pad, and a drain electrode of the first high voltage transistor is coupled to the internal circuit. The control circuit further includes a capacitor, a Zenar diode and a second resistor. One end of the capacitor is coupled to the pad, and the other end of the capacitor is coupled to the gate electrode of the first high voltage transistor. A positive electrode of the Zener diode is coupled to the gate electrode of the first high voltage transistor, and a negative electrode of the Zener diode is coupled to the pad. One end of the second resistor is coupled to the capacitor, the Zener diode and the control terminal of the first high voltage transistor, and the other end is grounded.

One of the advantages of the present disclosure is that the electrostatic discharge protection circuit provided by the present disclosure can reduce the layout area of the circuit design through the technical features of "the control circuit" and "the high voltage transistor", while limiting the voltage received by the internal circuit to be lower than its breakdown voltage when the electrostatic discharge (ESD) event occurs. On the other hand, under normal operation, "the high voltage transistor" is configured to operate in a linear region, such that the conductive resistance is relatively small and does not affect normal operation.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
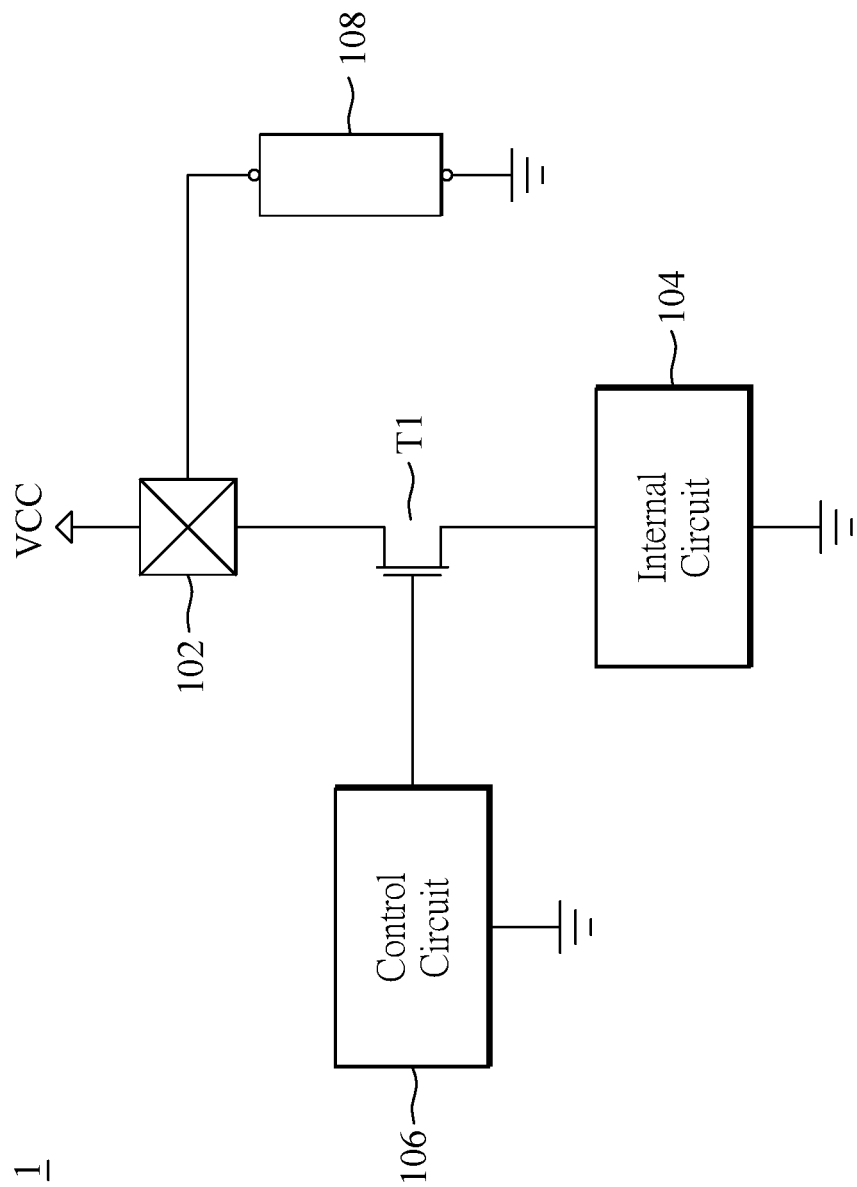
FIG. 1 is a circuit layout of an electrostatic discharge protection circuit according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The following is a description of an embodiment of the present disclosure relating to an "electrostatic discharge protection circuit" by a specific embodiment, and those skilled in the art can understand the advantages and effects of the present disclosure from the contents disclosed in the specification. The invention can be implemented or applied in various other specific embodiments, and various modifications and changes can be made without departing from the spirit and scope of the invention. In addition, the drawings of the present disclosure are merely illustrative and are not intended to be stated in the actual size. The following embodiments will further explain the related technical content of the present disclosure, but the disclosure is not intended to limit the scope of the present disclosure.

It should be understood that although the terms first, second, third, etc. may be used herein to describe various elements or signals, however, these elements or signals should not be limited by these terms. These terms are primarily used to distinguish one element from another or one signal from another. In addition, the term "or" as used herein may include a combination of any one or more of the associated listed items, depending on the actual situation.

First Embodiment

Reference is now made to FIG. 1, which is a circuit layout of an electrostatic discharge protection circuit according to a first embodiment of the present disclosure. As can be seen from FIG. 1, the first embodiment of the present disclosure provides an electrostatic discharge protection circuit 1 including a pad 102, an internal circuit 104, a control circuit 106, an electrostatic protection component 108, and a first high voltage transistor T1.

In detail, the pad 102 may receive the power supply voltage VCC from the high voltage source, and the first end of the first high voltage transistor T1 is coupled to the pad 102, the second end of the first high voltage transistor T1 is coupled to the internal circuit 104, and the first high voltage transistor T1 has a control terminal for controlling the first high voltage transistor T1 to be switched between ON and OFF states according to the voltage supplied thereto.

The electrostatic protection element 108 has one end coupled to the first end of the first high voltage transistor T1 and the other end grounded. The control circuit 106 is coupled between the control terminal of the first high voltage transistor T1 and a ground terminal. The control circuit 106 is configured to control the first high voltage transistor T1 to be turned off when receiving an electrostatic voltage at the ground terminal.

In the present embodiment, in order to avoid damage to components in the internal circuit 104 from the electrostatic discharge phenomena, the electrostatic protection component 108 may be directly coupled to the pad 102. For example, the electrostatic protection component 108 can be coupled in parallel to the first high voltage transistor T1 such that at least a portion of the electrostatic discharge charge can be separated via the electrostatic protection component 108.

In addition to the electrostatic protection elements 108 arranged in parallel to the first high voltage transistor T1, a control circuit 106 is also provided. The control circuit 106 can be, for example, a clamping circuit coupled between the ground terminal and the gate electrode of the first high voltage transistor T1. When an electrostatic event occurs, although the electrostatic protection element 108 is provided, the control circuit 106 can further detect the risen potential and control the voltage at the control terminal of the first high voltage transistor T1 to turn off the first high voltage transistor T1.

Thus, by adopting this configuration, the layout design of the internal circuit 104 may proceed under electrostatic protection standards that allow for lower voltage, thereby significantly reducing the area for circuit layout design, and the voltage received by the internal circuit can be limited to be lower than the breakdown voltage thereof when the electrostatic discharge (ESD) event occurs. On the other hand, under normal operation, the high voltage transistor is configured to operate in a linear region, so that the conductive resistance is relatively small and does not affect normal operation.

Second Embodiment

Figure 2:
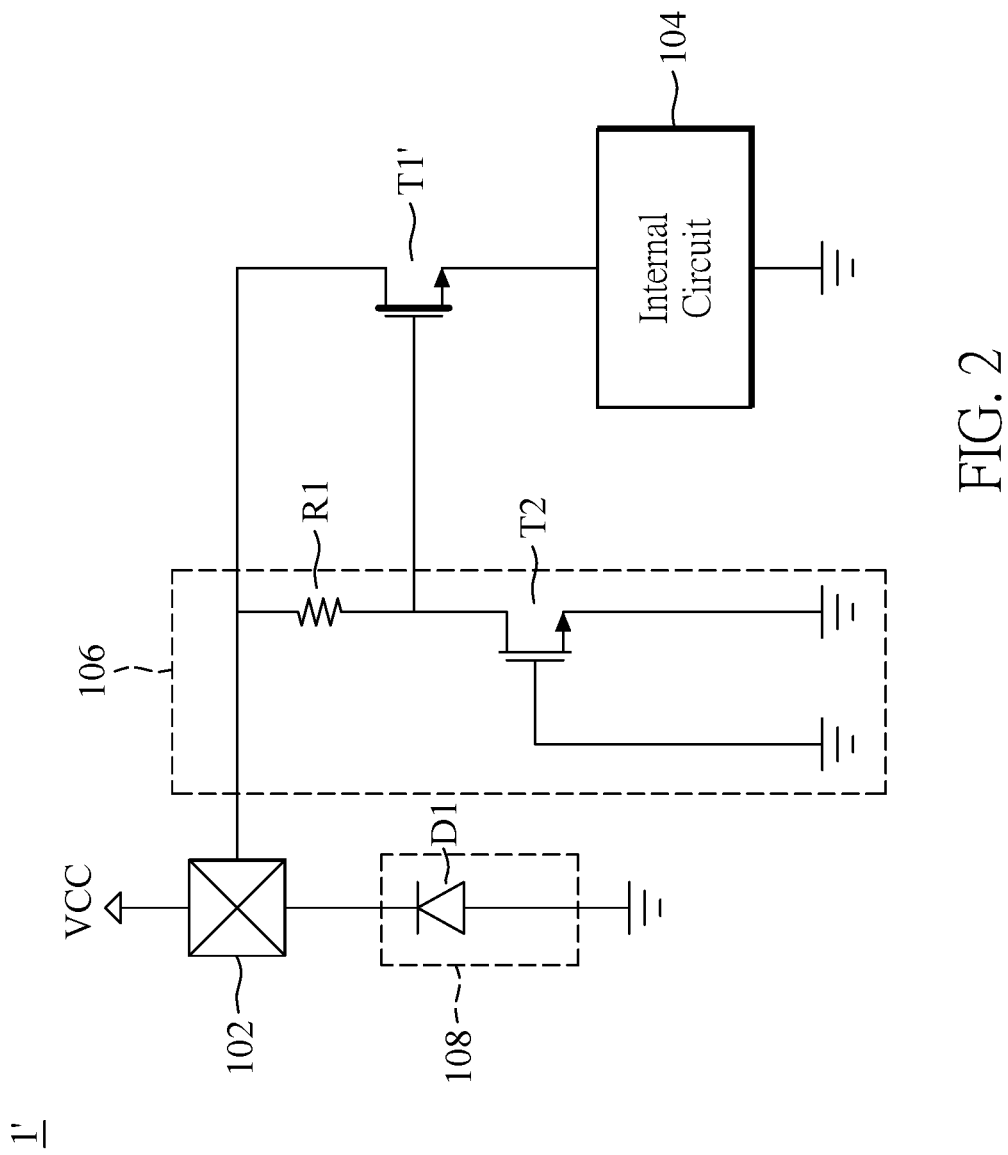
FIG. 2 is a circuit layout of an electrostatic discharge protection circuit according to a second embodiment of the present disclosure.

Reference is now made to FIG. 2, which is a circuit layout of an electrostatic discharge protection circuit according to a second embodiment of the present disclosure. As can be seen from FIG. 2, the second embodiment of the present disclosure provides an electrostatic discharge protection circuit 1' including a pad 102, an internal circuit 104, a control circuit 106, an electrostatic protection component 108, and a first high voltage transistor T1'. In the present embodiment, like elements are denoted by like reference numerals, and repeated description is omitted.

The ESD protection component 108 includes an ESD diode D1, and the ESD diode D1 has a positive pole coupled to the ground terminal and a negative pole coupled to the pad 102. In detail, the electrostatic protection component 108 can be, for example, the ESD diode D1, which is coupled in parallel within the circuit. When the circuit works normally, it is in an OFF state (high resistance state), which does not affect the normal operation of the circuit; when the circuit has an abnormal overvoltage and reaches its breakdown voltage, the ESD diode D1 can be quickly changed from a high-impedance state to a low-impedance state, which provides a low-impedance conduction path for the instantaneous current while clamping the abnormal high voltage within a safe level, thereby protecting the IC or the wire. When the abnormal overvoltage ceases, the ESD diode D1 returns to the high impedance state, and the circuit works normally. In the present embodiment, the breakdown voltage of the ESD diode D1 may be, for example, 50V.

On the other hand, in this embodiment, the first high voltage transistor T1' can be a depletion type N-type metal oxide semiconductor field effect transistor (MOSFET), and the drain electrode of the first high voltage transistor T1' is coupled to the pad 102. Preferably, the breakdown voltage of the first high voltage transistor T1' may be in the range of 12V to 100V, and preferably may be about 55V.

Furthermore, the control circuit 106 further includes a first resistor R1 and a second high voltage transistor T2. The first end of the first resistor R1 is coupled to the pad 102 and the drain electrode of the first high voltage transistor T1' A drain electrode of the second high voltage transistor T2 is coupled to a second end of the first resistor R1 and the control terminal of the first high voltage transistor T1', that is, the gate electrode, and the source electrode and the gate electrode of the second high voltage transistor T2 are grounded. The first resistor R1 may be provided with high resistance, for example, 100 kΩ. Moreover, the second high voltage transistor T2 may be, for example, an N-type laterally diffused metal oxide semiconductor (LDMOS) transistor, and the breakdown voltage can be greater than or equal to 40V.

For example, under the normal mode of operation, when no ESD event has occurred, the bias voltage at the gate electrode of the first high voltage transistor T1' is zero. Since the threshold voltage of the depletion type NMOSFET is lower than 0V, e.g., −0.7V, the first high voltage transistor T1' will always be in an ON state. Therefore, the first high voltage transistor T1' is configured to operate in the linear region, so that the conduction resistance is relatively small, and the internal circuit 104 can normally receive signals from the pad 102.

On the other hand, in the present embodiment, when an ESD event occurs, a voltage exceeding 40V will raise the potential through the second end of the first resistor R1, and when the potential exceeds the breakdown voltage of the second high voltage transistor T2, a current will be generated in a direction toward to the ground terminal through the second high voltage transistor T2, and a bias voltage exceeding 40V is generated to turn OFF the first high voltage transistor T1' to serve as a high-impedance equivalent resistance between the pad 102 and the internal circuit 104. Further, by adopting the configuration of the ESD electrostatic diode D1 and the first high-voltage transistor T1', the electrostatic voltage received by the internal circuit 104 can be limited to about 50V without reaching the breakdown voltages of the first high voltage transistor T1' and the internal circuit 104, thereby achieving the protection for the internal circuit 104.

Thus, by adopting this configuration, the layout design of the internal circuit 104 may proceed under electrostatic protection standards that allow for lower voltage, thereby significantly reducing the area for circuit layout design, and the voltage received by the internal circuit 104 can be limited to be lower than the breakdown voltage thereof when the electrostatic discharge (ESD) event occurs. On the other hand, under the normal mode of operation, the high voltage transistor is configured to operate in the linear region, so that the conductive resistance is relatively small and does not affect the normal operation.

Third Embodiment

Figure 3:
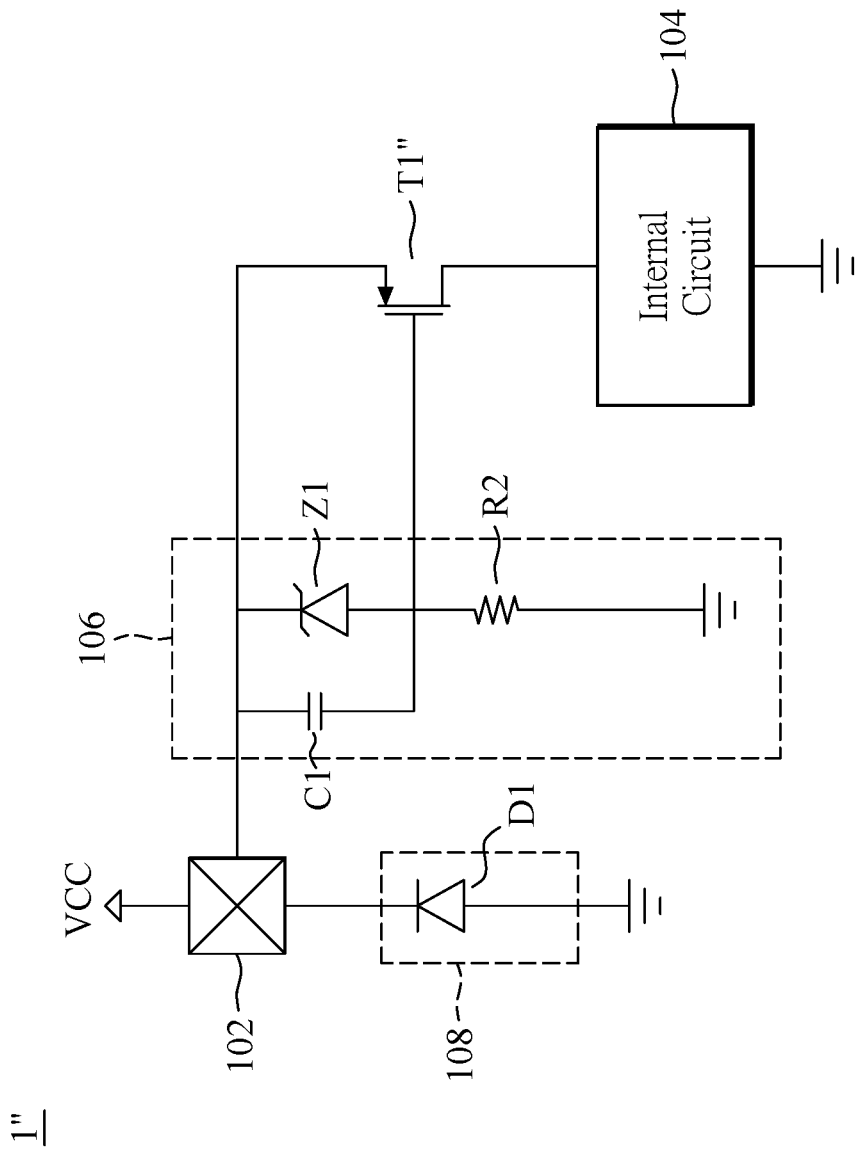
FIG. 3 is a circuit layout of an electrostatic discharge protection circuit according to a third embodiment of the present disclosure.

Reference is now made to FIG. 3, which is a circuit layout of an electrostatic discharge protection circuit according to a third embodiment of the present disclosure. As can be seen from FIG. 3, the third embodiment of the present disclosure provides an electrostatic discharge protection circuit 1" including a pad 102, an internal circuit 104, a control circuit 106, an electrostatic protection component 108, and a first high voltage transistor T1". In the present embodiment, like elements are denoted by like reference numerals, and repeated description is omitted.

Similarly, the electrostatic protection component 108 can be, for example, the ESD diode D1, which is coupled in parallel within the circuit. When the circuit works normally, it is in an OFF state (high-impedance state), which does not affect the normal operation of the circuit, and when the circuit has an abnormal overvoltage and reaches its breakdown voltage, the ESD diode D1 can be quickly changed from a high-impedance state to a low-impedance state, which provides a low-impedance conduction path for the instantaneous current while clamping the abnormal high voltage within a safe level, thereby protecting the IC or the wire. When the abnormal overvoltage ceases, the ESD diode D1 returns to the high impedance state, and the circuit works normally. In the present embodiment, the breakdown voltage of the ESD diode D1 may be, for example, 50V.

On the other hand, the first high voltage transistor T1" may be a P-type metal oxide semiconductor field effect transistor (MOSFET), and a source electrode of the first high voltage transistor T1" is coupled to the pad, and a drain electrode of the first high voltage transistor T1" is coupled to the internal circuit. Preferably, the breakdown voltage of the first high voltage transistor T1" may be 55V.

In more detail, in the present embodiment, the control circuit 106 further includes a capacitor C1, a Zenar diode Z1 and a second resistor R2. One end of the capacitor C1 is coupled to the pad 102, and the other end of the capacitor C1 is coupled to the gate electrode of the first high voltage transistor T1". A positive electrode of the Zener diode Z1 is coupled to the gate electrode of the first high voltage transistor T1", and a negative electrode of the Zener diode Z1 is coupled to the pad 102. One end of the second resistor R1 is coupled to the capacitor C1, the Zener diode Z1 and the control terminal of the first high voltage transistor T1", and the other end is grounded. The second resistor R2 can be provided with a high resistance value, for example, 400 k$\Omega$, and the reverse breakdown voltage of the Zener diode Z1 is 5V.

In general, even if the current changes, the Zener diode Z1 can maintain voltage stability without fluctuation, so that it can be installed on a circuit with constant voltage to protect the IC from surge currents and static electricity. Compared to the forward utilization of the conventional diode, the Zener diode can be used in reverse. The reverse breakdown voltage of the Zener diode is also referred to as the Zener voltage (VZ), and the current value thereof is referred to as the Zener current (IZ).

For example, under the normal mode of operation, when no ESD event has occurred, the gate electrode of the first high voltage transistor T1" is coupled to the ground terminal through the second resistor R2, and its bias voltage is low. Therefore, the first high voltage transistor T1" remains in the ON state. Since the first high voltage transistor T1' is configured to operate in the linear region, the conduction resistance is relatively small, and the internal circuit 104 can normally receive signals from the pad 102.

On the other hand, in the present embodiment, when an ESD event occurs, a voltage greater than 50V will cause the Zener diode Z1 to generate a reverse current to be shunt to ground, while the negative terminal of Zener diode Z1 will produce a bias voltage of about 5V. This bias voltage will cause the first high voltage transistor T1" to be turned OFF, and the first high voltage transistor T1" serves as a high-impedance resistance between the pad 102 and the internal circuit 104 for protecting the internal circuit 104.

Figure 4:
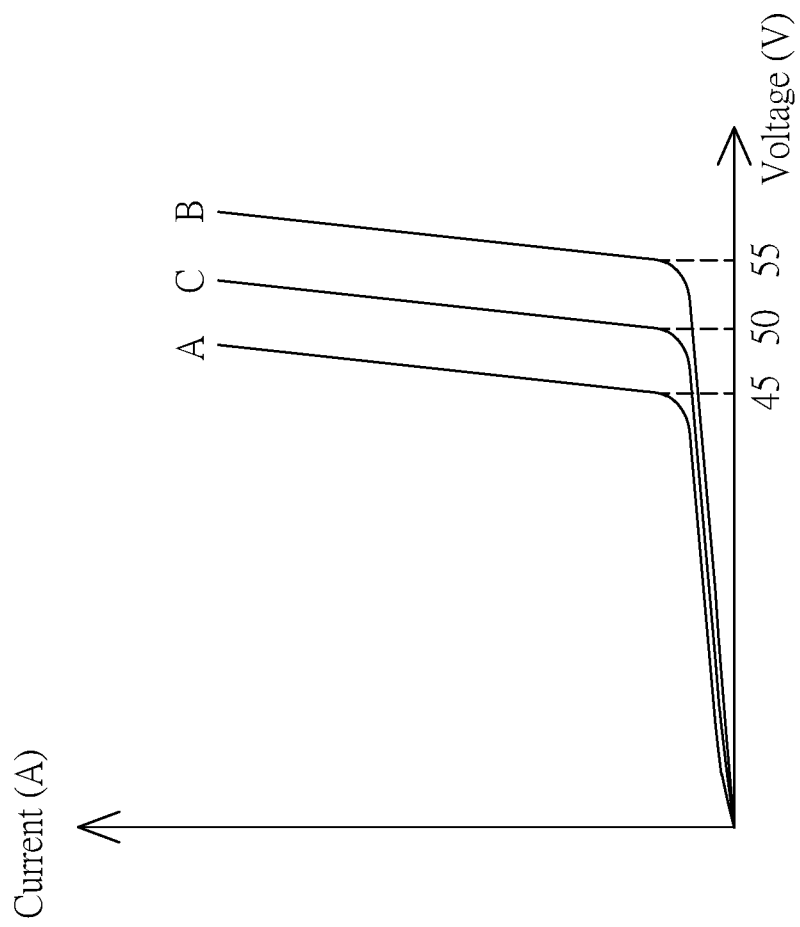
FIG. 4 is a graph showing voltage and current of an electrostatic discharge protection circuit of the present disclosure.

Reference is now made to FIG. 4, which is a graph showing voltage and current of an electrostatic discharge protection circuit of the present disclosure. As shown, graph A is the voltage-current graph in the electrostatic discharge (ESD) test, graph B is the threshold voltage current graph of the internal circuit 104, and graph C is the voltage and current of the protection circuit 106 when the protection mechanism is enabled during the electrostatic discharge (ESD) test. As can be seen from FIG. 4, the breakdown voltage of the electrostatic discharge (ESD) test is about 45V, the breakdown voltage of the internal circuit 104 is about 55V, and the electrostatic discharge protection circuit of the present disclosure may clamp the voltage received by the internal circuit 104 in the range of about 50V by adopting the configuration of the first high voltage transistor and the control circuit, such that the internal circuit 104 can be prevented from damage.

Thus, by adopting this configuration, the layout design of the internal circuit 104 may proceed under electrostatic protection standards that allow for lower voltage, thereby significantly reducing the area for circuit layout design, and the voltage received by the internal circuit 104 can be limited to be lower than the breakdown voltage thereof when the electrostatic discharge (ESD) event occurs. On the other hand, under the normal mode of operation, the high voltage transistor is configured to operate in the linear region, so that the conductive resistance is relatively small and does not affect the normal operation.

One of the advantages of the present disclosure is that the electrostatic discharge protection circuit provided by the present disclosure can reduce the layout area of the circuit design through the technical features of the "control circuit" and the "high voltage transistor", while limiting the voltage received by the internal circuit to be lower than its breakdown voltage when an electrostatic discharge (ESD) event occurs. On the other hand, under normal operating circumstances, the "high voltage transistor" is configured to operate in the linear region, such that the conductive resistance is relatively small and does not affect the normal operation.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electrostatic discharge (ESD) protection circuit comprising:
    an internal circuit;
    a pad;
    a first high voltage transistor having a first end directly coupled to the pad, and a second end directly coupled to the internal circuit and including a control terminal;
    an electrostatic protection element having one end directly coupled to the first end of the first high voltage transistor and the other end grounded;
    a control circuit coupled between the control terminal of the first high voltage transistor and a ground end, the control circuit configured to control the first high voltage transistor to be turned off when the pad receives an electrostatic voltage,
    wherein the first high voltage transistor is turned on when the pad does not receive the electrostatic voltage,
    wherein in response to the first high voltage transistor being turned on, the first high voltage transistor provides a conduction path from the pad to the internal circuit, and in response to the pad receiving an electrostatic voltage, the control circuit is configured to turn off the first high voltage transistor to disconnect the conduction path,
    wherein the control circuit includes:
        a first resistor having a first end directly connected to the pad and directly connected to a drain electrode of the first high voltage transistor; and
        a second high voltage transistor having a drain electrode directly connected to a second end of the first resistor and directly connected to the control terminal of the first high voltage transistor, and having a source electrode and a gate electrode that are directly connected to ground,
        wherein the first high voltage transistor is a depletion type N-type metal oxide semiconductor field effect transistor (MOSFET), the drain electrode of the first high voltage transistor is directly connected to the pad, and a source electrode of the first high voltage transistor is directly connected to the internal circuit.

2. The electrostatic discharge protection circuit according to claim 1, wherein a breakdown voltage of the first high voltage transistor is in a range of about 12V to 100V.

3. The electrostatic discharge protection circuit according to claim 1, wherein the second high voltage transistor is an N-type laterally diffused metal oxide semiconductor (LD-MOS) transistor.

4. The electrostatic discharge protection circuit according to claim 3, wherein the second high voltage transistor has a breakdown voltage greater than 40V.

5. The electrostatic discharge protection circuit according to claim 1, wherein the resistance of the first resistor is about 100 kΩ.

6. The electrostatic discharge protection circuit according to claim 1, wherein the electrostatic protection element includes an ESD diode having a positive electrode that is grounded and a negative electrode coupled to the pad.

* * * * *